(12) United States Patent
Wang (10) Patent No.: US 9,281,455 B2
(45) Date of Patent: Mar. 8, 2016

(54) LED PACKAGING STRUCTURE HAVING CONCAVE LENS STRUCTURE AT LIGHT-EMITTING SIDE OF LED CHIP

(71) Applicants: BOE TECHNOLOGY GROUP CO., LTD., Beijing (CN); BOE OPTICAL SCIENCE AND TECHNOLOGY CO., LTD., Suzhou (CN)

(72) Inventor: Tao Wang, Beijing (CN)

(73) Assignees: BOE TECHNOLOGY GROUP CO., LTD., Beijing (CN); BOE OPTICAL SCIENCE AND TECHNOLOGY CO., LTD., Suzhou (CN)

(*) Notice: Subject to any disclaimer, the term of this patent is extended or adjusted under 35 U.S.C. 154(b) by 0 days.

(21) Appl. No.: 14/495,546

(22) Filed: Sep. 24, 2014

(65) Prior Publication Data
US 2015/0364656 A1 Dec. 17, 2015

(30) Foreign Application Priority Data
Jun. 17, 2014 (CN) .......................... 2014 1 0270528

(51) Int. Cl.
*H01L 33/00* (2010.01)
*H01L 33/50* (2010.01)
*H01L 33/58* (2010.01)
*H01L 33/08* (2010.01)

(52) U.S. Cl.
CPC .............. *H01L 33/502* (2013.01); *H01L 33/08* (2013.01); *H01L 33/58* (2013.01); *H01L 2933/0033* (2013.01); *H01L 2933/0041* (2013.01); *H01L 2933/0058* (2013.01)

(58) Field of Classification Search
CPC .......... H01L 33/55; H01L 33/58; H01L 33/62
USPC .................................. 257/81, 95, 98, 99, 100
See application file for complete search history.

(56) References Cited

U.S. PATENT DOCUMENTS

| 8,471,271 B2* | 6/2013 | Son ................................ 257/88 |
| 9,029,903 B2* | 5/2015 | Son ................................ 257/99 |
| 2004/0046242 A1* | 3/2004 | Asakawa ...................... 257/678 |
| 2013/0146911 A1* | 6/2013 | Lin et al. ......................... 257/98 |

\* cited by examiner

*Primary Examiner* — Quoc Hoang
(74) *Attorney, Agent, or Firm* — Harness, Dickey & Pierce, P.L.C.

(57) ABSTRACT

According to an LED packaging structure and packaging method thereof provided by the present disclosure, the LED may comprise a support having a cavity and at least one LED chip placed in the cavity. After the cavity is filled with a fluorescent adhesive, at least one concave lens structure may be formed at a light emitting side of the LED chip.

7 Claims, 5 Drawing Sheets

LED PACKAGING STRUCTURE HAVING CONCAVE LENS STRUCTURE AT LIGHT-EMITTING SIDE OF LED CHIP

CROSS-REFERENCE TO RELATED APPLICATION

The present application claims a priority of the Chinese patent application No. 201410270528.0 filed on Jun. 17, 2014, which is incorporated herein by reference in its entirety.

TECHNICAL FIELD

The present disclosure relates to the field of photoelectric technology, in particular to a lighting emitting diode (LED) packaging structure and packaging method, a display device, and an illuminating device.

BACKGROUND

With the development of LED technology, LED has been widely used in more and more technical fields due to its superior performance. For example, various existing display devices adopt LED as an illuminating source. Specifically, for example, LED is used as a backlight source.

Figure 1:
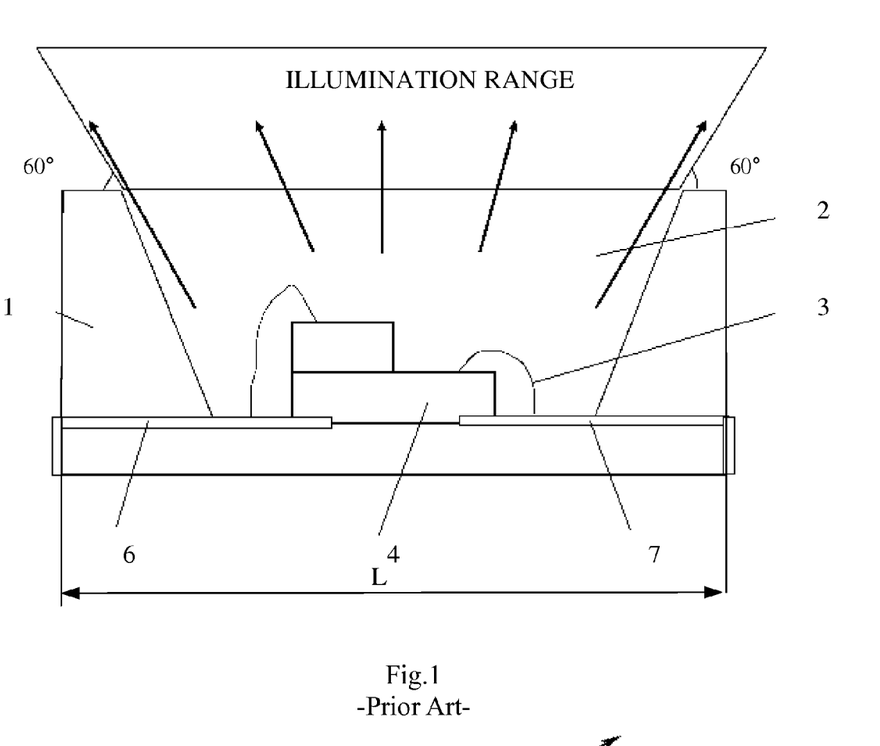
FIG. 1 illustrates an existing LED packaging structure.

FIG. 1 illustrates an existing LED packaging structure. This LED packaging structure includes a support 1 having a cavity; a metal layer disposed at the bottom of the cavity; a first electrode area 6 and a second electrode area 7 included in the metal layer; at least one LED chip 4 disposed on the metal layer, an anode and a cathode of the LED chip 4 being connected with the first electrode area 6 and the second electrode area 7 of the metal layer respectively through gold lines 3; a fluorescent adhesive 2 filled in the cavity of the support 1. The fluorescent adhesive 2 is prepared by mixing fluorescent powder with packaging adhesive in a certain ratio, and the fluorescent powder in the fluorescent adhesive 2 is evenly distributed. When the LED chip emits light, the fluorescent powder absorbs light and is stimulated into various colors.

However, the existing LED packaging structure has the problem of small visual angle. As shown in FIG. 1, the visual angles of the existing LED packaging structures are all about 120°, which limits the irradiation range and irradiation effect of the LED packaging structures. Thus, when the LED packaging structure is used as a backlight source of a liquid crystal display (LCD), it may easily cause glowworm defect of the LCD.

The prior art generally enhances the visual angle of the LED packaging structure through improving the fluorescent powder formulation or improving the material of the support, but these methods are difficult to be developed, have high research and development costs, and are not easy to be implemented.

SUMMARY

The technical problem to be solved by the present disclosure is to provide an LED packaging structure and packaging method, a display device, and an illuminating device having a wide visual angle, which can enlarge the illumination range of a LED at a relatively low cost and improve the illumination effect of the LED.

In order to solve the above technical problem, an embodiment of the present disclosure provides a technical solution as below:

In one aspect, an LED packaging method is provided, wherein the LED comprises a support having a cavity and at least one LED chip placed in the cavity. After the cavity is filled with a fluorescent adhesive, the method may comprise the following step of: forming at least one concave lens structure at a light emitting side of the LED chip.

Furthermore, the step of forming at least one concave lens structure at a light emitting side of the LED chip may comprise:

forming at least one concave lens structure at a light emitting side of the LED chip by using a transparent packaging adhesive.

Furthermore, the packaging method may further comprise:

securing at least one LED chip on a metal layer at a bottom of the cavity;

connecting respectively an anode and a cathode of the at least one LED chip with a first electrode area and a second electrode area of the metal layer by using gold lines;

pouring fluorescent adhesive in a molten state into the cavity, a surface opposite to the bottom of the cavity being a plane after the fluorescent adhesive cures; and pouring transparent packaging adhesive in the molten state onto the fluorescent adhesive such that a surface opposite to the bottom of the cavity comprises at least one inward concave surface after the transparent packaging adhesive cures.

Furthermore, the packaging method may further comprise:

securing at least one LED chip on a metal layer of the bottom of the cavity;

connecting respectively an anode and a cathode of the at least one LED chip with a first electrode area and a second electrode area of the metal layer by using gold lines;

pouring fluorescent adhesive in a molten state into the cavity, a surface opposite to the bottom of the cavity comprising at least one outward convex surface after the fluorescent adhesive cures; and pouring transparent packaging adhesive in the molten state onto the fluorescent adhesive such that a surface opposite to the bottom of the cavity comprises at least one inward concave surface after the transparent packaging adhesive cures.

Furthermore, the inward concave surface may be in one-to-one correspondence with the LED chip, and an axis of each inward concave surface may coincide with an axis of the corresponding LED chip; when the surface opposite to the bottom of the cavity comprises at least one outward convex surface after the fluorescent adhesive cures, the outward convex surface may be in one-to-one correspondence with the LED chip, and an axis of each outward convex surface may coincide with an axis of the corresponding LED chip.

Another embodiment of the present disclosure further provides an LED packaging structure, wherein the LED comprises a support having a cavity and at least one LED chip placed in the cavity, and a light emitting side of the LED chip is provided with at least one concave lens structure.

Furthermore, a curvature radius of the concave lens structure may be L/2–3 L, where L is a width of the support.

Furthermore, the packaging structure may further comprise:

a metal layer comprising a first electrode area and a second electrode area, disposed at a bottom of the cavity;

a fluorescent adhesive portion filled inside the cavity, a surface of the fluorescent adhesive portion opposite to the bottom of the cavity being a plane; and a transparent packaging adhesive portion located on the fluorescent adhesive portion, a surface of the transparent packaging adhesive portion opposite to the bottom of the cavity comprising at least one inward concave surface, wherein the at least one LED chip is secured on the metal layer, and an anode and a cathode of the at least one LED chip are respectively connected with the first electrode area and the second electrode area through gold lines.

Furthermore, the inward concave surface may be in one-to-one correspondence with the LED chip, and an axis of each inward concave surface may coincide with an axis of the corresponding LED chip.

Furthermore, the packaging structure may further comprise:

a metal layer comprising a first electrode area and a second electrode area, disposed at a bottom of the cavity;

a fluorescent adhesive portion filled inside the cavity, a surface of the fluorescent adhesive portion opposite to the bottom of the cavity comprising at least one outward convex surface; and a transparent packaging adhesive portion located on the fluorescent adhesive portion, a surface of the transparent packaging adhesive portion opposite to the bottom of the cavity comprising at least one inward concave surface, wherein the at least one LED chip is secured on the metal layer, and an anode and a cathode of the at least one LED chip are respectively connected with the first electrode area and the second electrode area through gold lines.

Furthermore, the inward concave surface may be in one-to-one correspondence with the LED chip, and an axis of each inward concave surface may coincide with an axis of the corresponding LED chip; and the outward convex surface may be in one-to-one correspondence with the LED chip, and an axis of each outward convex surface may coincide with an axis of the corresponding LED chip.

Furthermore, a curvature radius of the inward concave surface may be L/2–3 L, where L is a width of the support.

Furthermore, the transparent packaging adhesive portion is made of a substance having a hot melting state and a high light transmittance. For example, the transparent packaging adhesive portion may be made of epoxy resin.

Another embodiment of the present disclosure further provides a display device, comprising the LED packaging structure as described above.

Another embodiment of the present disclosure further provides an illuminating device, comprising the LED packaging structure as described above.

The embodiments of the present disclosure have the following beneficial effects:

In the above schemes, at least one concave lens structure is formed at the light emitting side of the LED chip. Since the concave lens has the ability of scattering light rays, the light rays emitted from the LED chip, after being scattered by the concave lens, can increase the visual angle of the LED. In this way, it does not need to improve the fluorescent powder formulation or improve the material of the support, and the illumination range of the LED can be enlarged and the illumination effect of the LED can be improved at a relatively low cost.

| Reference signs | | |
|---|---|---|
| 1 Support; | 2 Fluorescent adhesive; | 3 Gold line; |
| 4 LED chip; | 5 Transparent packaging adhesive; | |
| 6 First electrode area; | 7 Second electrode area. | |

DETAILED EMBODIMENTS

The specific embodiments of the present disclosure will be described hereinafter in conjunction with the drawings and examples. The following examples are merely used to explain the present invention, but shall not be used to limit the scope of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. The described embodiments are just a part but not all of the embodiments of the present disclosure. All other embodiment(s) obtained by those skilled in the art based on the described embodiments herein should be within the scope of the present disclosure.

Unless otherwise defined, technical jargons or scientific terms used herein should be interpreted in the usual sense as understood by those ordinary skilled in the relevant art of the present disclosure. The terms "first", "second", and the like, used in the specification and claims of this patent application of the present disclosure, do not denote any order, quantity, or importance, but are used to distinguish among different integral parts. Similarly, the terms "a", "an", and the like, herein do not denote a limitation of quantity, but rather denote the presence of at least one of the referenced item. The phrases "connection" or "connected" or the like, are not limited to physical or mechanical connections, but may comprise electrical connection, whether direct or indirect. The phrases "on", "under", "left", "right" and the like, are only used to indicate a relative positional relationship, which may be correspondingly changed as an absolute position of a described object is changed.

In order to make objects, technical solutions and advantages of the embodiments of the present disclosure apparent, description will be made in connection with the drawings and specific examples.

In view of the problem of small visual angle of the LED structure in the prior art, the embodiments of the present disclosure provide an LED packaging structure and packaging method, a display device, and an illuminating device having a wide visual angle, which can enlarge the illumination range of an LED and improve the illumination effect of the LED at a relatively low cost.

An embodiment of the present disclosure provides an LED packaging method, the LED comprising a support having a cavity and at least one LED chip placed in the cavity. After the cavity is filled with fluorescent adhesive, at least one concave lens structure is formed at a light emitting side of the LED chip.

Figure 2:
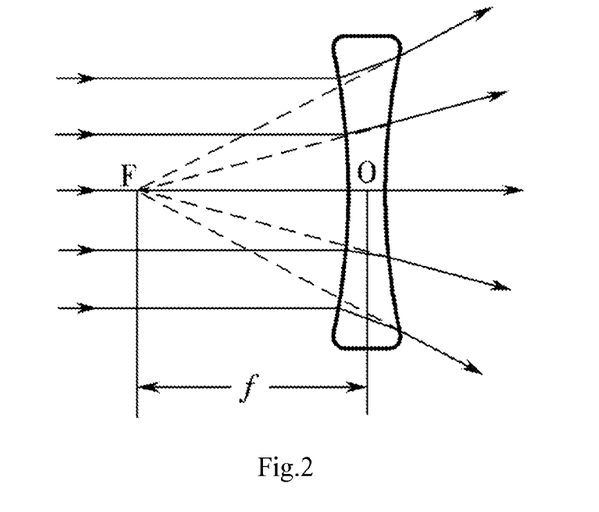
FIG. 2 illustrates the principle of a concave lens scattering light rays.

According to the LED packaging method provided by the present disclosure, at least one concave lens structure is formed at the light emitting side of the LED chip. As shown in FIG. 2, since the concave lens has the ability of scattering light rays, the light rays emitted from the LED chip, after being scattered by the concave lens, can increase the visual angle of the LED. In this way, it does not need to improve the fluorescent powder formulation or improve the material of the support, and the illumination range of the LED can be enlarged and the illumination effect of the LED can be improved at a relatively low cost.

Specifically, one or more concave lenses may be formed at the light emitting side of the LED chip. When a plurality of concave lenses are formed at the light emitting side of the LED chip, the plurality of concave lenses may be or may not be in one-to-one correspondence with the LED chips. The present disclosure is not limited thereto, provided that a plurality of concave lenses are formed at the light emitting side of the LED chip. In this way, the light rays can be scattered after passing through the concave lens structure, thereby improving the LED visual angle.

Furthermore, the step of forming at least one concave lens structure at a light emitting side of the LED chip comprises:

forming at least one concave lens structure at a light emitting side of the LED chip by using transparent packaging adhesive.

In the embodiment of the present disclosure, the fluorescent adhesive refers to fluorescent adhesive that is prepared by mixing fluorescent powder with transparent packaging adhesive in a certain ratio. In addition, the fluorescent powder in the fluorescent adhesive is evenly distributed. The fluorescent adhesive may be a single kind of fluorescent powder or a combination of a plurality of kinds of fluorescent powder. The transparent packaging adhesive is free of fluorescent powder, and it may be silica gel, silicon resin or epoxy resin, etc. The embodiment of the present disclosure uses transparent packaging adhesive to form the concave lens, in which way it does not need to adapt a packaging machine or use new packaging materials, and the visual angle of the LED can be improved without increasing the costs, and thus the feasibility is high.

Furthermore, the packaging method may specifically comprise:

securing at least one LED chip on a metal layer at a bottom of the cavity;

connecting respectively an anode and a cathode of the at least one LED chip with a first electrode area and a second electrode area of the metal layer by using gold lines;

pouring fluorescent adhesive in a molten state into the cavity, a surface opposite to the bottom of the cavity being a plane after the fluorescent adhesive cures;

pouring transparent packaging adhesive in the molten state onto the fluorescent adhesive such that a surface opposite to the bottom of the cavity comprises at least one inward concave surface after the transparent packaging adhesive cures.

Furthermore, the inward concave surface is in one-to-one correspondence with the LED chip, and an axis of each inward concave surface coincides with an axis of the corresponding LED chip, whereby the light rays emitted from each LED chip can be scattered so as to make the light rays more even.

Furthermore, the packaging method may specifically comprise:

securing at least one LED chip on a metal layer of the bottom of the cavity;

connecting respectively an anode and a cathode of the at least one LED chip with a first electrode area and a second electrode area of the metal layer by using gold lines;

pouring fluorescent adhesive in a molten state into the cavity, a surface opposite to the bottom of the cavity comprising at least one outward convex surface after the fluorescent adhesive cures;

pouring transparent packaging adhesive in the molten state onto the fluorescent adhesive such that a surface opposite to the bottom of the cavity comprises at least one inward concave surface after the transparent packaging adhesive cures. In this way, a bi-concave concave lens structure is formed so that the light rays can be better scattered.

Furthermore, the outward convex surface is in one-to-one correspondence with the LED chip, and an axis of each outward convex surface coincides with an axis of the corresponding LED chip. The inward concave surface is in one-to-one correspondence with the LED chip, and an axis of each inward concave surface coincides with an axis of the corresponding LED chip. In this way, the light rays can be scattered more evenly.

Another embodiment of the present disclosure further provides an LED packaging structure, wherein the LED comprises a support having a cavity and at least one LED chip placed in the cavity, and a light emitting side of the LED chip is provided with at least one concave lens structure.

According to the LED packaging structure of the present disclosure, at least one concave lens structure is formed at a light emitting side of the LED chip. As shown in FIG. 2, since the concave lens has the ability of scattering light rays, the light rays emitted from the LED chip, after being scattered by the concave lens, can increase the visual angle of the LED. In this way, it does not need to improve the fluorescent powder formulation or improve the material of the support, and the illumination range of the LED can be enlarged and the illumination effect of the LED can be improved at a relatively low cost. A concave lens is formed in the light emitting direction of each LED chip by using transparent packaging adhesive.

Specifically, one or more concave lenses may be formed at the light emitting side of the LED chip 4. When a plurality of concave lenses are formed at the light emitting side of the LED chip 4, the plurality of concave lenses may be or may not be in one-to-one correspondence with the LED chips 4. The present disclosure is not limited thereto, provided that a plurality of concave lenses are formed at the light emitting side of the LED chip.

For example, a plurality of LED chips are arranged in sequence in a length direction of the support. In order that the scattering effect of light rays is better, the curvature radius of the concave lens is preferably L/2–3 L, where L is a width of the support.

Furthermore, the packaging structure may specifically comprise:

a support having a cavity, the bottom of the cavity being a metal layer comprising a first electrode area and a second electrode area;

at least one LED chip secured on the metal layer, an anode and a cathode of the at least one LED chip being respectively connected with the first electrode area and the second electrode area through gold lines;

a fluorescent adhesive portion filled inside the cavity, a surface of the fluorescent adhesive portion opposite to the bottom of the cavity being a plane; and a transparent packaging adhesive portion located on the fluorescent adhesive portion, a surface of the transparent packaging adhesive portion opposite to the bottom of the cavity comprising at least one inward concave surface. In this way, a plano-concave lens structure is formed, which will not bring along any burden on the process costs and meanwhile can increase the visual angle of the LED.

For example, the fluorescent adhesive portion may fill a part of the cavity, or may fill an entirety of the cavity, provided that the transparent packaging adhesive portion is located on the fluorescent adhesive portion.

Furthermore, the inward concave surface is in one-to-one correspondence with the LED chip, and an axis of each inward concave surface coincides with an axis of the corresponding LED chip.

Furthermore, the packaging structure may further comprise:

a support having a cavity, the bottom of the cavity being a metal layer comprising a first electrode area and a second electrode area;

at least one LED chip secured on the metal layer, an anode and a cathode of the at least one LED chip being respectively connected with the first electrode area and the second electrode area through gold lines;

a fluorescent adhesive portion filled inside the cavity, a surface of the fluorescent adhesive portion opposite to the bottom of the cavity comprising at least one outward convex surface; and a transparent packaging adhesive portion located on the fluorescent adhesive portion, a surface of the transparent packaging adhesive portion opposite to the bottom of the cavity comprising at least one inward concave surface, wherein the fluorescent adhesive portion may fill a part of the cavity, or may fill an entirety of the cavity, provided that the transparent packaging adhesive portion is located on the fluorescent adhesive portion.

Furthermore, the outward convex surface is in one-to-one correspondence with the LED chip, and an axis of each outward convex surface coincides with an axis of the corresponding LED chip. The inward concave surface is in one-to-one correspondence with the LED chip, and an axis of each inward concave surface coincides with an axis of the corresponding LED chip, whereby the light rays emitted from each LED chip can be scattered so as to make the light rays more even.

The LED packaging structure and packaging method according to the present disclosure will be described in detail below with reference to specific embodiments.

The First Embodiment

Figure 3:
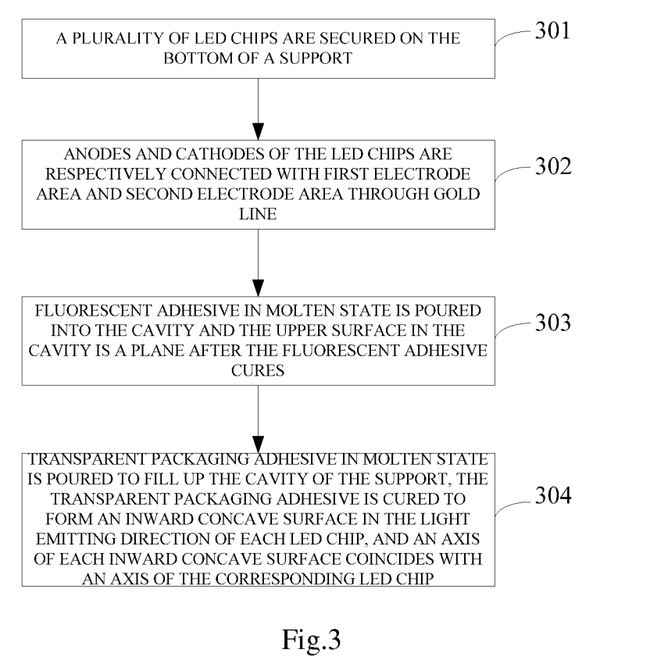
FIG. 3 illustrates a flow chart of an LED packaging method according to the first embodiment of the present disclosure.

As shown in FIG. 3, the LED packaging method of this embodiment specifically comprises:

Step 301, a plurality of LED chips are secured on the bottom of a support.

Figure 4:
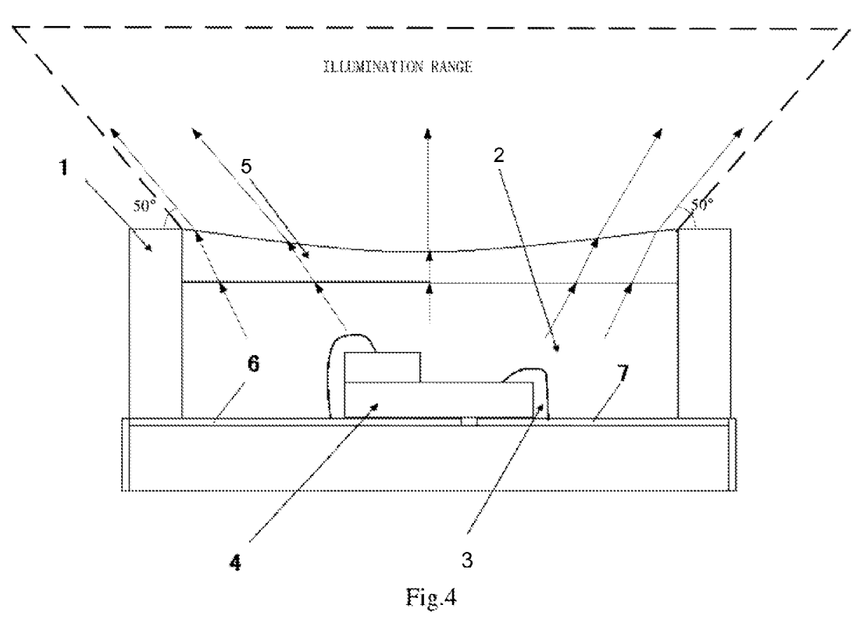
FIG. 4 illustrates an LED packaging structure according to the first embodiment of the present disclosure.

As shown in FIG. 4, a support 1 has a cavity, and the bottom of the cavity is a metal layer comprising a first electrode area 6 and a second electrode area 7. Specifically, the LED chip 4 may be secured on the metal layer by using solid crystal adhesive. The solid crystal adhesive may be epoxy resin or silica gel. It should be pointed out that FIG. 4 only shows the case of one LED chip 4.

Step 302, an anode and a cathode of the LED chip are respectively connected with the first electrode area and the second electrode area through gold lines.

The anodes and the cathodes of the plurality of LED chips 4 are respectively connected with the first electrode area 6 and the second electrode area 7 through gold lines 3.

Step 303, fluorescent adhesive in a molten state is poured into the cavity, and the upper surface in the cavity is a plane after the fluorescent adhesive cures.

The fluorescent adhesive is heated to melt. Then the fluorescent adhesive in the molten state is poured into the cavity of the support and the fluorescent adhesive does not fill up the whole cavity. A parameter of the device for pouring the fluorescent adhesive may be set to control the amount of the fluorescent adhesive poured into the cavity of the support. Since the fluorescent adhesive is in the molten state before being poured into the cavity of the support, the surface of the fluorescent adhesive 2 can naturally form a plane upon curing after being poured into the cavity of the support.

Step 304, transparent packaging adhesive in the molten state is poured to fill up the cavity of the support, and the transparent packaging adhesive is cured to form an inward concave surface in a light emitting direction of each LED chip. An axis of each inward concave surface coincides with an axis of the corresponding LED chip. It should be appreciated that the inward concave surface may not be in one-to-one correspondence with the LED chip in order to simplify the process. For example, only one inward concave surface is formed on the LED chip, whereby the effect of scattering the light rays emitted from the LED can also be achieved, which will not be explained in detail here.

Specifically, after the poured fluorescent adhesive cures, the transparent packaging adhesive is heated to melt. For example, the transparent packaging adhesive in the molten state is poured into the cavity of the support. Preferably, the transparent packaging adhesive in the molten state is poured to fill up the cavity of the support. Afterwards, a plurality of moulds each having an outward convex surface are pressed on the transparent packaging adhesive. The moulds are in one-to-one correspondence with the LED chips. For example, the outward convex surfaces of the mould face toward the LED chips and an axis of the outward convex surface coincides with an axis of its corresponding LED chip. The outward convex surface of the mould has subjected to polishing treatment, therefore the transparent packaging adhesive will not adhere to the mould. The moulds are removed after the transparent packaging adhesive 5 cures, whereby the transparent packaging adhesive forms an inward concave surface in the light emitting direction of each LED chip, an axis of the inward concave surface coincides with an axis of its corresponding LED chip. In this way, a concave lens whose incident light surface is flat and whose outgoing light surface is concave is formed by using the transparent packaging adhesive. The transparent packaging adhesive may be epoxy resin, or may be a substance having a molten state and a high light transmittance. In order that the scattering effect of light rays is better, the curvature radius of the inward concave surface lens is preferably L/2–3 L, where L is a width of the support 1.

Figure 5:
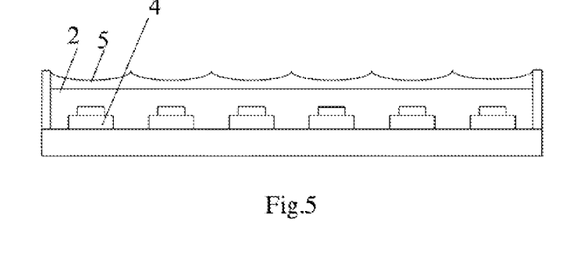
FIG. 5 illustrates an LED packaging structure in a length direction of the support according to the first embodiment of the present disclosure.

The LED packaging structure as shown in FIG. 4 can be formed through the above steps 301-304. FIG. 5 is another schematic diagram of the LED packaging structure in a length direction of the support according to this embodiment. As shown in FIG. 5, a concave lens is formed in the light emitting direction of each LED chip by using the transparent packaging adhesive in this embodiment. Since the transparent packaging adhesive is free of fluorescent powder, the formed concave lens has the ability of scattering light rays. As shown in FIG. 4, the light rays emitted from the LED chip, after being scattered by the concave lens, can increase the visual angle of the LED. In this way, it does not need to improve the fluorescent powder formulation or improve the material of the support or adapt the packaging machine. In addition, the visual angle of the LED can be improved, the illumination range of the LED can be enlarged and the illumination effect of the LED can be improved without increasing the costs, and thus the feasibility is high.

The Second Embodiment

Figure 6:
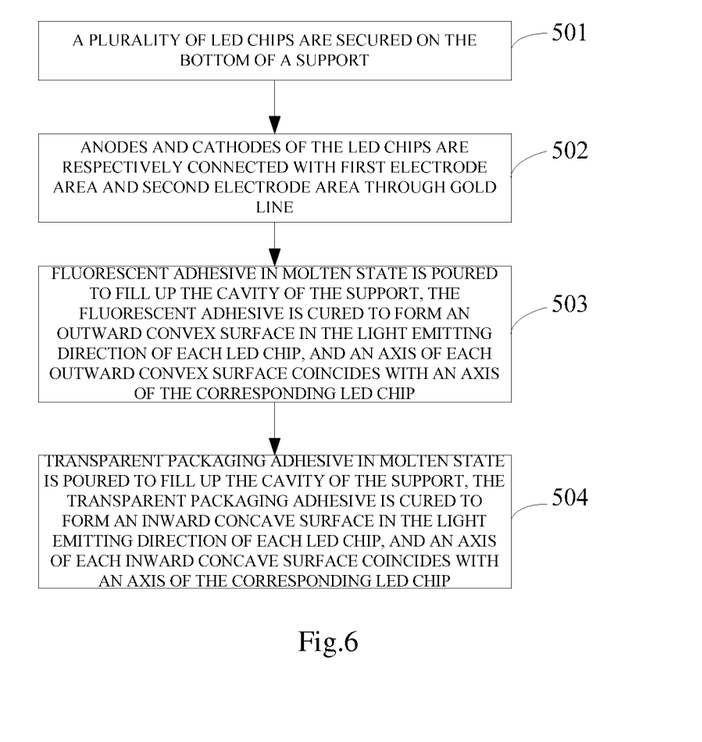
FIG. 6 illustrates a flow chart of an LED packaging method according to the second embodiment of the present disclosure.

As shown in FIG. 6, the LED packaging method of this embodiment specifically comprises:

Step 501, a plurality of LED chips are secured on the bottom of a support.

Figure 7:
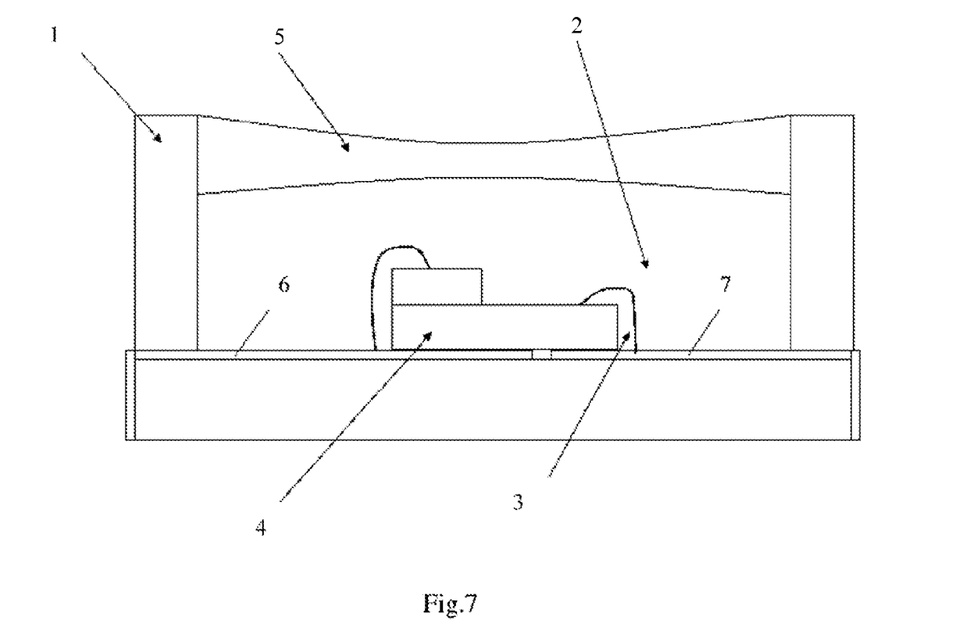
FIG. 7 illustrates an LED packaging structure according to the second embodiment of the present disclosure.

As shown in FIG. 7, a support 1 has a cavity, and the bottom of the cavity is a metal layer comprising a first electrode area 6 and a second electrode area 7. Specifically, the LED chip 4 may be secured on the metal layer by using solid crystal adhesive. The solid crystal adhesive may be epoxy resin or silica gel. It should be pointed out that FIG. 7 only shows the case of one LED chip 4.

Step 502, an anode and a cathode of the LED chip are respectively connected with the first electrode area and the second electrode area through gold lines.

The anodes and the cathodes of the plurality of LED chips 4 are respectively connected with the first electrode area 6 and the second electrode area 7 through gold lines 3.

Step 503, fluorescent adhesive in a molten state is poured into the cavity, an outward convex surface is formed in a light emitting direction of each LED chip after the fluorescent adhesive cures, and an axis of each outward convex surface coincides with an axis of the corresponding LED chip.

The fluorescent adhesive is heated to melt. Then the fluorescent adhesive in the molten state is poured into the cavity of the support and the fluorescent adhesive does not fill up the whole cavity. A parameter of the device for pouring the fluorescent adhesive may be set to control the amount of the fluorescent adhesive poured into the cavity of the support. Afterwards, a plurality of moulds each having an inward concave surface are pressed on the fluorescent adhesive. The moulds are in one-to-one correspondence with the LED chips. The inward concave surfaces of the mould face toward the LED chips and an axis of the inward concave surface coincides with an axis of its corresponding LED chip. Since the inward concave surface of the mould has subjected to polishing treatment, the fluorescent adhesive will not adhere to the mould. The moulds are removed after the fluorescent adhesive 2 cures, whereby the fluorescent adhesive forms an outward convex surface in the light emitting direction of each LED chip, the axis of the outward convex surface coincides with the axis of its corresponding LED chip.

Step 504, transparent packaging adhesive in the molten state is poured to fill up the cavity of the support, and the transparent packaging adhesive is cured to form an inward concave surface in a light emitting direction of each LED chip. An axis of each inward concave surface coincides with an axis of the corresponding LED chip.

Specifically, after Step 503, the transparent packaging adhesive is heated to melt. The transparent packaging adhesive in the molten state is poured into the cavity of the support. Preferably, the transparent packaging adhesive in the molten state is poured to fill up the cavity of the support. Afterwards, a plurality of moulds each having an outward convex surface are pressed on the transparent packaging adhesive. The moulds are in one-to-one correspondence with the LED chips. The outward convex surfaces of the mould face toward the LED chips and an axis of the outward convex surface coincides with an axis of its corresponding LED chip. The outward convex surface of the mould has subjected to polishing treatment, therefore the transparent packaging adhesive will not adhere to the mould. The moulds are removed after the transparent packaging adhesive 5 cures, whereby the transparent packaging adhesive forms an inward concave surface in the light emitting direction of each LED chip, an axis of the inward concave surface coincides with an axis of its corresponding LED chip. In this way, a concave lens whose incident light surface is concave and whose outgoing light surface is concave is formed by using the transparent packaging adhesive. The transparent packaging adhesive may be epoxy resin, or may be a substance having a molten state and a high light transmittance. In order that the scattering effect of light rays is better, the curvature radius of the inward concave surface lens is preferably L/2–3 L, where L is a width of the support 1.

Figure 8:
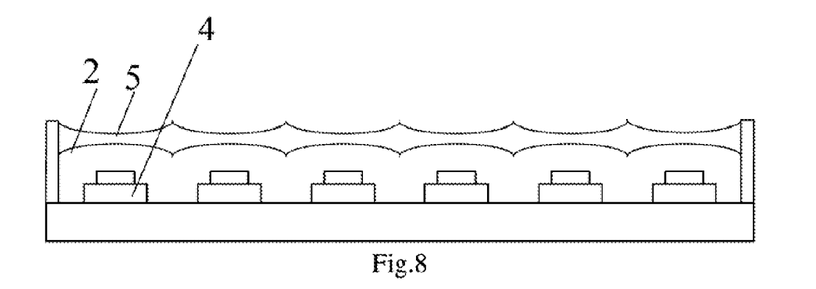
FIG. 8 illustrates an LED packaging structure in a length direction of the support according to the second embodiment of the present disclosure.

The LED packaging structure as shown in FIG. 7 can be formed through the above steps 501-504. FIG. 8 is a schematic diagram of the LED packaging structure in a length direction of the support according to this embodiment. As shown in FIG. 8, a concave lens is formed in the light emitting direction of each LED chip by using the transparent packaging adhesive in this embodiment. Since the transparent packaging adhesive is free of fluorescent powder, the formed concave lens has the ability of scattering light rays. As shown in FIG. 7, the light rays emitted from the LED chip, after being scattered by the concave lens, can increase the visual angle of the LED. In this way, it does not need to improve the fluorescent powder formulation or improve the material of the support or adapt the packaging machine. In addition, the visual angle of the LED can be improved, the illumination range of the LED can be enlarged and the illumination effect of the LED can be improved without increasing the costs, and thus the feasibility is high.

The present disclosure further provides a display device, comprising the LED packaging structure as described above. The display device may be any products or parts having a display function such as a liquid crystal panel, an e-paper, an OLED panel, a Liquid Crystal Display Television, a Liquid Crystal Display, a digital photo frame, a mobile phone, a tablet PC, etc.

The present disclosure further provides an illuminating device, comprising the LED packaging structure as described above.

In the various method embodiments of the present disclosure, the sequence number of each step is not intended to limit the order of the steps. For a person having ordinary skill in the art, the change in the order of steps made without doing any creative work shall also fall within the protection scope of the present disclosure.

What is describe above is preferred embodiments of the present disclosure. It should be pointed out that a person skilled in the art may make several improvements and modifications to these embodiments without departing from the principle of the present invention, and these improvements and modifications shall be deemed to fall within the protection scope of the present invention.

What is claimed is:

1. A lighting emitting diode (LED) packaging structure comprising a support having a cavity and at least one LED chip placed in the cavity, wherein a light emitting side of the LED chip is provided with at least one concave lens structure, wherein the packaging structure further comprises from its bottom to top:
   a metal layer including a first electrode area and a second electrode area, disposed at a bottom of the cavity;
   a fluorescent adhesive portion filled inside the cavity, wherein an upper surface of the fluorescent adhesive portion opposite to the bottom of the cavity includes at least one outward convex surface; and a transparent packaging adhesive portion located on the fluorescent adhesive portion, wherein an upper surface of the transparent packaging adhesive portion opposite to the bottom of the cavity includes at least one inward concave surface, wherein the at least one LED chip is secured on the metal layer, and an anode and a cathode of the at least one LED chip are respectively connected with the first electrode area and the second electrode area through gold lines.

2. The LED packaging structure according to claim 1, wherein a curvature radius of the concave lens structure is L/2-3 L, where L is a width of the support.

3. The LED packaging structure according to claim 1, wherein
the inward concave surface is in one-to-one correspondence with the LED chip, and an axis of each inward concave surface coincides with an axis of the corresponding LED chip; and
the outward convex surface is in one-to-one correspondence with the LED chip, and an axis of each outward convex surface coincides with an axis of the corresponding LED chip.

4. The LED packaging structure according to claim 1, wherein the packaging structure is applied in an illuminating device.

5. A display device at least comprising a lighting emitting diode (LED) packaging structure comprising a support having a cavity and at least one LED chip placed in the cavity, wherein a light emitting side of the LED chip is provided with at least one concave lens structure;

wherein the packaging structure further comprises from its bottom to top:
a metal layer including a first electrode area and a second electrode area, disposed at a bottom of the cavity;
a fluorescent adhesive portion filled inside the cavity, wherein an upper surface of the fluorescent adhesive portion opposite to the bottom of the cavity includes at least one outward convex surface; and
a transparent packaging adhesive portion located on the fluorescent adhesive portion, wherein an upper surface of the transparent packaging adhesive portion opposite to the bottom of the cavity includes at least one inward concave surface, wherein the at least one LED chip is secured on the metal layer, and an anode and a cathode of the at least one LED chip are respectively connected with the first electrode area and the second electrode area through gold lines.

6. The display device according to claim 5, wherein a curvature radius of the concave lens structure is L/2-3 L, where L is a width of the support.

7. The display device according to claim 5, wherein
the inward concave surface is in one-to-one correspondence with the LED chip, and an axis of each inward concave surface coincides with an axis of the corresponding LED chip; and
the outward convex surface is in one-to-one correspondence with the LED chip, and an axis of each outward convex surface coincides with an axis of the corresponding LED chip.

* * * * *